United States Patent
Ohtsuka

(10) Patent No.: US 7,977,764 B2
(45) Date of Patent: Jul. 12, 2011

(54) SEMICONDUCTOR DEVICE

(75) Inventor: Masaya Ohtsuka, Kobe (JP)

(73) Assignee: Ricoh Company, Ltd., Tokyo (JP)

(*) Notice: Subject to any disclaimer, the term of this patent is extended or adjusted under 35 U.S.C. 154(b) by 160 days.

(21) Appl. No.: 12/146,187

(22) Filed: Jun. 25, 2008

(65) Prior Publication Data

US 2009/0001507 A1    Jan. 1, 2009

(30) Foreign Application Priority Data

Jun. 26, 2007   (JP) .................................. 2007-167173

(51) Int. Cl.
  *H01L 23/525*   (2006.01)
  *H01L 21/44*    (2006.01)

(52) U.S. Cl. ......... 257/529; 257/E23.149; 257/E21.476; 438/601

(58) Field of Classification Search .................... 257/529
See application file for complete search history.

(56) References Cited

U.S. PATENT DOCUMENTS 6,163,062 A * 12/2000 Shiratake et al. ............. 257/529

FOREIGN PATENT DOCUMENTS

| JP | 05-074947 | 3/1993 |
| JP | 11-135631 | 5/1999 |
| JP | 2000-286341 | 10/2000 |

* cited by examiner

*Primary Examiner* — Jarrett J Stark
*Assistant Examiner* — Lawrence Tynes, Jr.
(74) *Attorney, Agent, or Firm* — Dickstein Shapiro LLP

(57) ABSTRACT

A semiconductor device that includes a metal fuse which may be used for redundancy or trimming, allowing for adjustment in the characteristics of a circuit. The fuse includes a disconnecting metal, a plurality of metal-vias that are connected under respective ends of the disconnecting metal, and a plurality of interconnections that connect to the disconnecting metal through respective metal-vias. The disconnecting metal is disconnected by a laser exposure and the metal-vias are located inside of the spot diameter of the laser used for the laser exposure, and are spaced apart from a side surface of the disconnecting metal. The disconnecting metal is formed of a material having a melting point and a boiling point that is lower than the melting point and boiling point of the metal-vias.

5 Claims, 3 Drawing Sheets

US 7,977,764 B2

SEMICONDUCTOR DEVICE

FIELD OF THE INVENTION

The present invention relates to a semiconductor device that includes a metal interconnecting layer that acts as a fuse that can be disconnected by laser exposure. The fuse is used, for example, for redundancy or trimming, allowing for adjustment in the characteristics of the circuit.

BACKGROUND

Recently, semiconductor devices have seen an increase in processing speed by using a fine process as well as analog circuitry, such as a sensor circuit. Especially in a case that an absolutely accurate resistance element is required, the fact that a variation in the amount of analog data output from a circuit varies depending upon the characteristic variation among the transistors is a problem. The variation amount of analog data can be corrected to a predetermined resistance value by disconnecting a fuse made from a poly-silicon or a metal interconnection, or in other words "trimming." In addition, the trimming serves as a redundancy for defective parts of a DRAM.

A poly-silicon fuse has a disconnection process that includes a simultaneous liquification and vaporization of the poly-silicon fuse by laser exposure. However a metal fuse made from, for example an aluminum, has a disconnection process wherein the vaporization occurs after the liquification. The metal fuse remains in a liquid state longer than a poly-silicon fuse remains in a liquid state. Therefore, in the case of a metal fuse, the liquefied metal can scatter when it is in the liquid state. If the scattered metal attaches to a side of an aperture formed by the laser exposure, there may be caused a defect, such as an incomplete disconnection. An example of this is shown in FIG. 4.

FIG. 4 shows a photograph of a top view of a prior metal fuse after the laser exposure. The photograph is taken with a scanning type electric microscope. An opening 103 is formed in metal fuse 101 by the laser exposure at an insulation layer on the metal fuse 101. As can be seen in FIG. 4, there is a portion of the metal fuse 101 which is not disconnected, "non-disconnection part" 105, at the right side of the opening 103. In addition, scattered liquefied metal can be seen on both sides of the opening 103.

Furthermore, the metal fuse is configured as a metal interconnection layer. For example, a metal layer made from AlCu is formed on a barrier metal layer formed of Ti/TiN stacked sequentially from a bottom layer. Additionally, Ti/TiN layers, such as a cap-metal, are stacked sequentially on the metal layer. In a case where the metal fuse includes the barrier metal, the non-disconnection parts occur on an edge side of the barrier metal, when the metal fuse is disconnected by the laser exposure. As a result of this, the metal fuse is not completely disconnected.

An example of a prior fuse structure is discussed in Japanese Laid-Open Patent Publication No. 2000-286341 (Patent document 1). In Patent document 1, a fuse structure configured as a first metal interconnection layer and a second metal interconnection layer, where the second metal interconnection layer is located above the first metal interconnection and connected to the first metal interconnection through vias. In the Patent document 1, when there is a plurality of fuses, the vias are located alternately. As a result of this, a fuse pitch is shortened.

In addition, another example of a prior fuse structure is discussed in Japanese Laid-Open Publication No. H05-74947. In Patent document 2, an anti-fuse is configured as an electric conductive region located on a semiconductor board and vias located on the electric conductive region through a high dielectric layer. The anti-fuse, which functions conversely to the usual disconnection fuse, is not electrically conductive until the high dielectric layer is provided with a pulse voltage, at which time the condition of the high dielectric layer changes. As a result of this, the high dielectric layer becomes conductive since the resistance value of the high dielectric layer decreases.

SUMMARY OF INVENTION

The present invention relates to a semiconductor device that includes a metal interconnecting layer that acts as a fuse that may disconnect by a laser exposure. A purpose of the invention includes an improvement in the certainty of fuse disconnection by laser exposure.

The present invention is constructed such as follows for achieving the above objectives. The semiconductor device comprises: a metal fuse that includes a disconnecting metal that is disconnected by a laser exposure, a plurality of metal-vias that are connected under respective ends of the disconnecting metal, and a plurality of interconnections that connect to the disconnecting metal through respective metal-vias; wherein the metal-vias are located inside of a spot diameter of a laser used for the laser exposure, and spaced apart from a side surface of the disconnecting metal.

A space between the metal-via and a side of the disconnecting metal of the fuse is a large enough a distance such that insulation between any remaining part of the disconnecting metal and the metal-via is maintained, in a case where the disconnecting metal of the fuse has a remaining part that is not disconnected on the side thereof after the laser exposure. Preferably, the space is more than 0.05 μm. More preferably, the space is more than 0.2 μm.

In one exemplary aspect, a surface of the disconnecting metal of the fuse is smaller than the spot diameter of the laser.

In another exemplary aspect, the disconnecting metal of the fuse is made from a material that has a melting point and a boiling point below those of the metal-vias. In one exemplary aspect, the disconnecting metal of the fuse is made from aluminum, and the metal-vias are made from tungsten.

BRIEF DESCRIPTION OF DRAWINGS

FIG. 1-B is a cross-sectional view at position A-A' of FIG. 1-A.

FIG. 3-B shows the photograph of FIG. 3-A from a diagonal top view.

DETAILED DESCRIPTION OF PREFERRED EMBODIMENTS

The semiconductor device comprises: a metal fuse that includes a disconnecting metal that is disconnected by a laser exposure, a plurality of metal-vias that are connected under respective ends of the disconnecting metal, and a plurality of interconnections that connect to the disconnecting metal through respective metal-vias; wherein the metal-vias are located inside of a spot diameter of a laser used for the laser exposure, and spaced apart from a side surface of the disconnecting metal. As a result of this arrangement, the remaining portion of the disconnecting metal of the fuse and the metal-vias can be insulated from each other, even if the disconnecting metal of the fuse has a remaining portion at the side thereof after the laser exposure or if the scattered metal sticks on the side of opening formed by the laser exposure. Namely, the disconnection certainty of the fuse improves. The fuse structure of the semiconductor of the present invention is especially effective in a stack structure of semiconductor that is configured to the barrier metal and the disconnecting metal of the fuse on the barrier metal.

In the semiconductor of the present invention, the surface of the disconnecting metal of the fuse is smaller than the spot diameter of the laser used for laser exposure. As a result of this arrangement, when the fuse is exposed by the laser, the amount of scattered metal is reduced in comparison to an amount of scattered metal in the prior art in the region of the laser exposure. As a result of this arrangement, the remaining portion of the disconnecting metal of the fuse and the metal-vias can be insulated from each other, even if the disconnecting metal of the fuse has a remaining portion on the side thereof after the laser exposure or if the scattered metal sticks on the side of opening formed by the laser exposure. Namely, the disconnection certainty of the fuse is improved.

In addition, the disconnecting metal of the fuse is made from a material that has a melting point and a boiling point lower than those of the material of the metal-vias. For example, the disconnecting metal of the fuse is made from aluminum and the metal-vias are made from tungsten. As a result of this arrangement, since only the disconnecting metal of the fuse can be disconnected and scattered without the liquification or the vaporization of the metal-vias, the amount of the scattered metal is reduced even more.

Figure 1A:
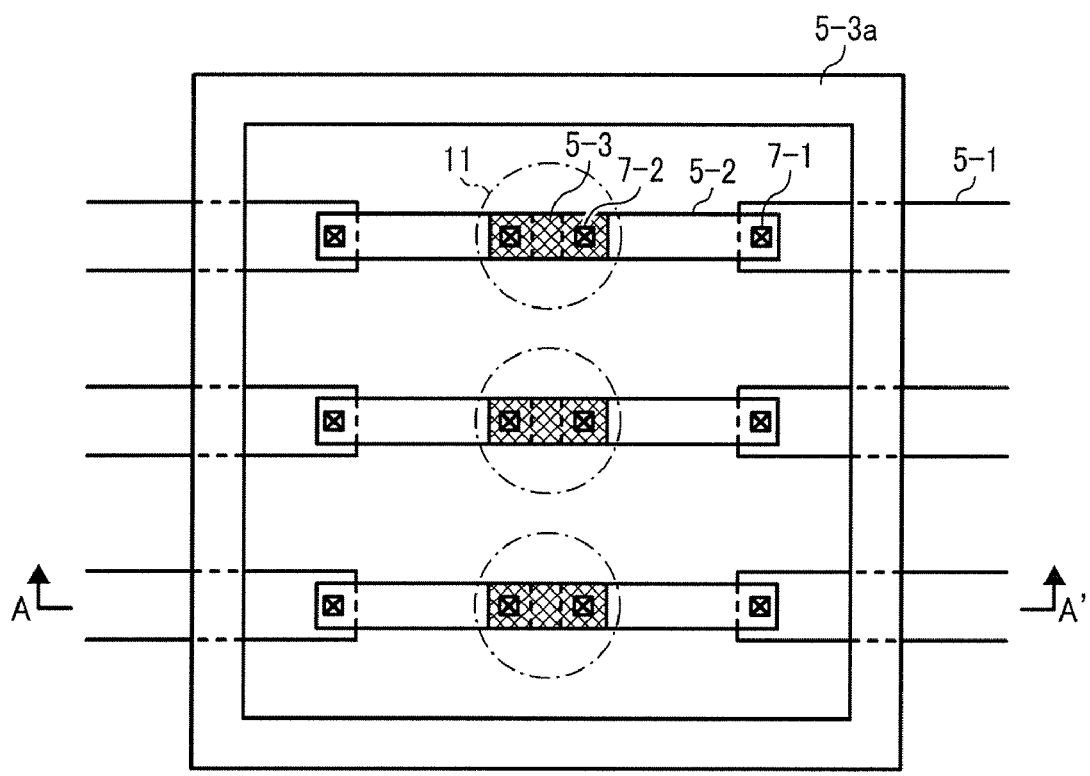
FIG. 1-A is a plane view illustrating a fuse part of one embodiment of the present invention.
Figure 1B:
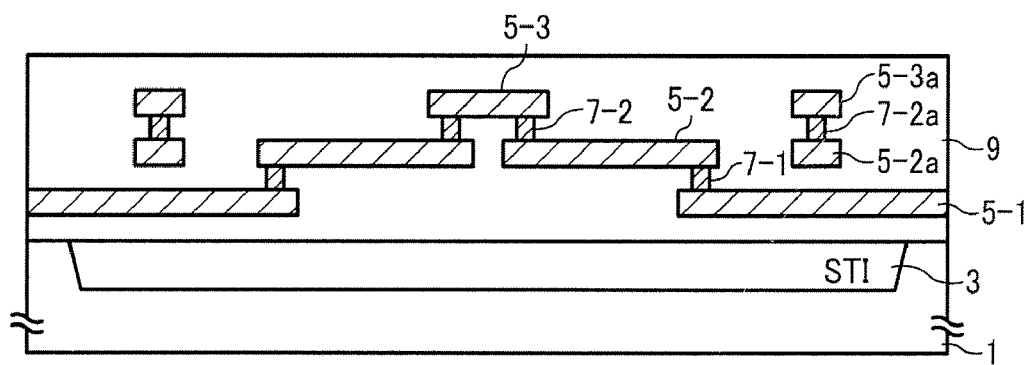

Referring now to the figures, FIG. 1-A is a plane view illustrating a fuse part of one embodiment of the present invention. FIG. 1-B is a cross-sectional view at position A-A' of FIG. 1-A. In FIG. 1-A, the insulating film is not shown. In FIG. 1-B, an interlevel insulating film and a top passivation film are shown.

A STI (Shallow Trench Isolation) region 3 for separation of elements is provided within a semiconductor substrate 1. First metal interconnection layers 5-1 are formed within the interlevel insulating film 9 over the STI region 3.

Second layer metal interconnection layers 5-2 are formed within the interlevel insulating film 9 and over the first layer metal interconnection layer 5-1. The second layer metal interconnection layers 5-2 comprise an under layer interconnection of the fuse. There are two second layer metal interconnection layers 5-2 for each fuse. The second layer metal interconnection layers 5-2 connect to the first layer metal interconnection layers 5-1 through metal-vias 7-1, which are provided over the first layer metal interconnection layers 5-1.

A second layer guard-ring metal interconnection layer 5-2*a* (not shown in FIG. 1-A) is formed around a layout region of the second layer metal interconnection layers 5-2. The second layer guard-ring metal interconnection layer 5-2*a* is insulated from the first layer metal interconnection layers 5-1 and the second layer metal interconnection layers 5-2.

A third layer metal interconnection layer 5-3 is formed above the second layer metal interconnection 5-2 and within the interlevel insulating film 9. In FIG. 1-A, the third layer metal interconnection layer 5-3 is shown in a dots pattern. The third layer metal interconnection layer 5-3 comprises the disconnecting metal of the fuse. There is one third metal interconnection layer 5-3 formed for each fuse. The third layer metal interconnection layer 5-3 is located inside the second layer guard-ring metal interconnection layer 5-2*a*, as can be seen from the top view. A metal-via 7-2 is located under each end of the third layer metal interconnection layer 5-3, respectively. The third layer metal interconnection layer 5-3 connects to the second layer metal interconnection layers through metal-vias 7-2.

A third layer guard-ring metal interconnection layer 5-3*a* is formed within the interlevel insulating film 9 above the second layer guard-ring metal interconnection layer 5-2*a*. The third layer guard-ring metal interconnection layer 5-3*a* is connected to the second layer guard-ring metal interconnection layer 5-2*a* through a guard-ring metal-vias 7-2*a*, which are located between the second layer guard-ring metal interconnection layer 5-2*a* and the third layer guard-ring metal interconnection layer 5-3*a*.

The top passivation film is formed over the third layer metal interconnection layer 5-3 and the third layer guard-ring metal interconnection layer 5-3*a*. In FIG. 1-B, the interlevel insulating film 9 and the top passivation film are illustrated to unify. In FIG. 1-A, a dashed-line circle indicates a spot diameter 11 of a laser used for the laser exposure.

In this embodiment, the fuse includes the third layer metal interconnection layer 5-3, two metal-vias 7-2 and two second layer metal interconnection layers 5-2. Further, the second layer guard-ring metal interconnection layer 5-2*a*, the guard-ring metal-via 7-2*a* and the third layer guard-ring metal interconnection layer 5-3*a* are located around the fuse and work as a guard-ring.

Each of the metal interconnection layers 5-1, 5-2, 5-2*a*, 5-3 and 5-3*a* are formed of, for example, aluminum. Each of the metal-vias 7-1, 7-2 and 7-2*a* are formed of, for example, tungsten. The melting point of aluminum is 660 degrees Celsius. The boiling point of aluminum is 2,486 degrees Celsius. The melting point of tungsten is 3,382 degrees Celsius. The boiling point of tungsten is 5,927 degrees Celsius. In the fuse, the melting point and the boiling point of the third layer metal interconnection layer 5-3 are lower than those of the metal-vias 7-2.

A surface size of the third layer metal interconnection layer 5-3 which is disconnected by the laser exposure is smaller than the laser spot diameter 11. For example, when the laser spot diameter 11 is 3.7 µm, a length of the third metal interconnection layer 5-3 may be 3.5 µm and a width of the third metal interconnection layer 5-3 may be 0.9 µm.

The surface of each of the metal-vias 7-2 is smaller than the width of the third layer metal interconnection layer 5-3. The metal-vias 7-2 are located spaced from a side of the third layer metal interconnection layer 5-3. For example, a surface shape of each metal-vias 7-2 is a circle. A diameter of the circle is 0.3 µm. A distance between the side of the third layer metal interconnection layer 5-3 and the metal-via 7-2 is 0.3 µm. Each of the metal-vias 7-2 is located within the spot diameter of the laser used for laser exposure. The metal-vias 7-2 may be spaced apart from each other at a distance of 2.3 µm.

Figure 2:
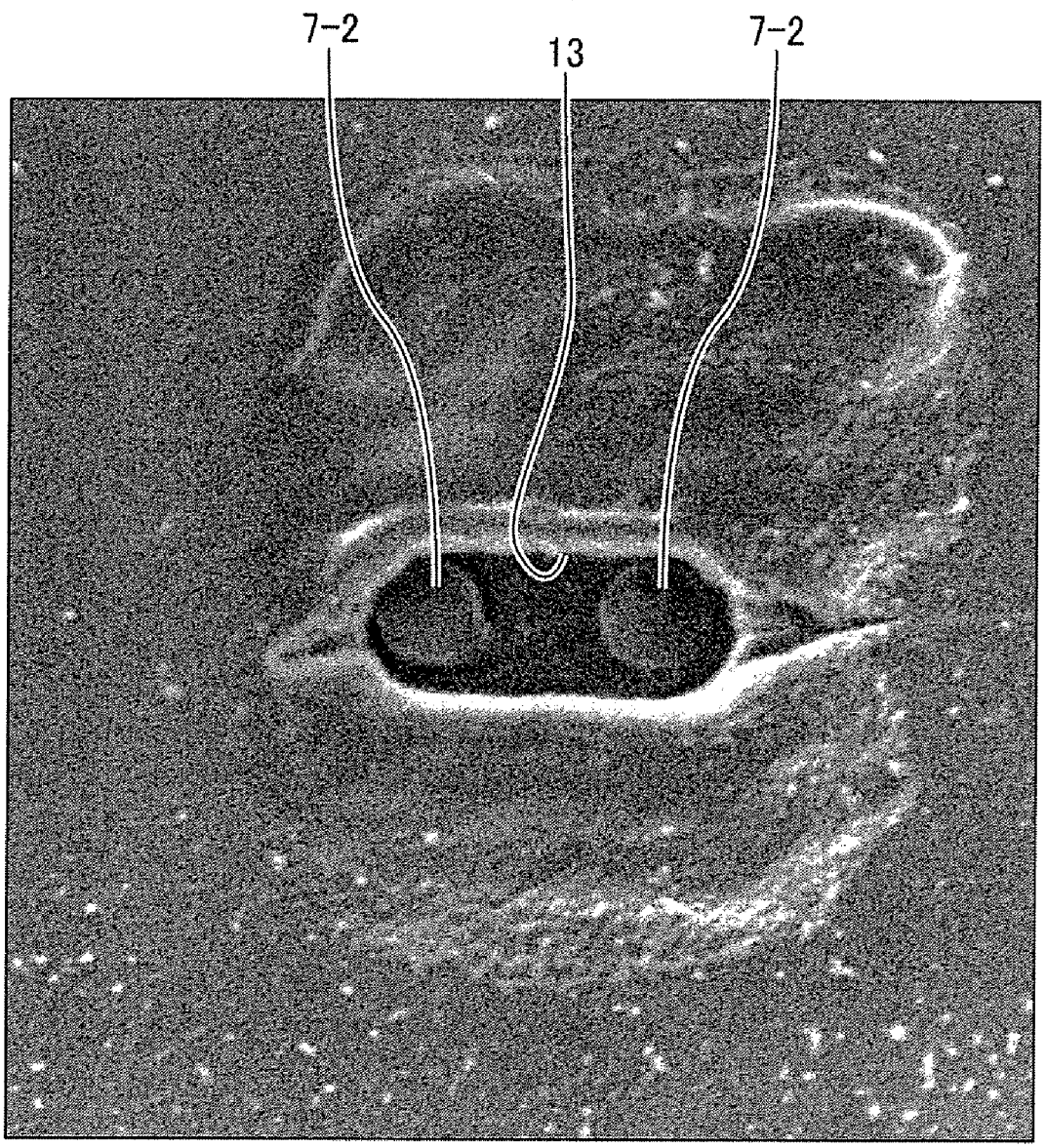
FIG. 2 is a photograph taken with a scanning electron microscope which shows the fuse of FIG. 1 after disconnection by laser exposure.

FIG. 2 is a photograph taken with a scanning electron microscope which shows the fuse of FIG. 1 after disconnection by laser exposure. The third layer metal interconnection layer 5-3 and the top passivation layer over layer 5-3 are scattered by the laser exposure. As a result, an opening 13 is formed. The tops of two metal-vias 7-2 crop out in the opening 13. Specifically, the melting point and the boiling point of the tungsten of the metal-vias 7-2 are higher than those of aluminum of the third layer metal interconnection layer 5-3. As a result, the metal-vias 7-2 are not liquefied or vaporized when the laser exposure occurs. When the third metal interconnection layer 5-3 is blown off, the space between the two metal-vias 7-2 is completely insulated.

In the embodiment of FIG. 1, the amount of the scattered metal during laser exposure is reduced in comparison with the amount of scattered metal in the prior art. This is because the surface of the third layer metal interconnection layer 5-3 is smaller than the spot diameter of the laser used for laser exposure. Thus, the problem that the fuse cannot be completely disconnected due to sticking of the scattered metal on the side of the opening 13 (e.g., FIG. 2) is prevented. This results in an improved certainty of the fuse disconnection.

Further, in FIG. 2, the space between the two metal-vias 7-2 can be insulated, since the metal-vias 7-2 are located away from the side of the third layer metal interconnection layer 5-3, even if the third layer metal interconnection layer 5-3 has remaining undisconnected metal on the side thereof after the laser exposure or the scattered metal sticks on the side of opening formed by the laser exposure.

In addition, the third layer metal interconnection metal layer 5-3 is made from aluminum, and the metal-vias 7-2 are made from tungsten, the melting point and the boiling point of which is higher than those of aluminum. Thus, the metal-vias 7-2 are prevented from liquefying, and therefore from scattering, during the laser exposure. The amount of the scattered metal decreases furthermore.

Figure 3A:
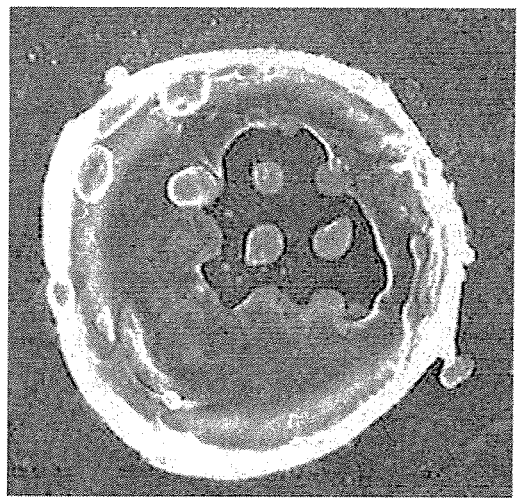
FIG. 3-A shows a photograph taken with a scanning electron microscope showing a top view of a state that an aluminum layer formed over a tungsten layer that was exposed by the laser.
Figure 3B:
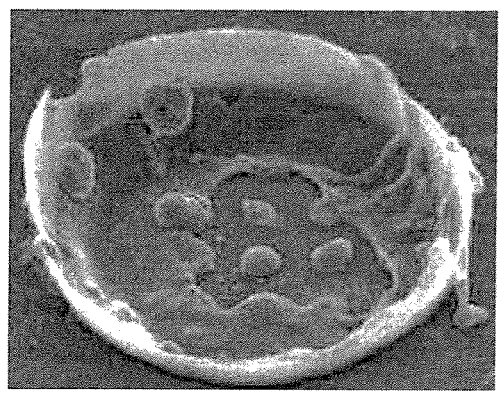
Figure 4:
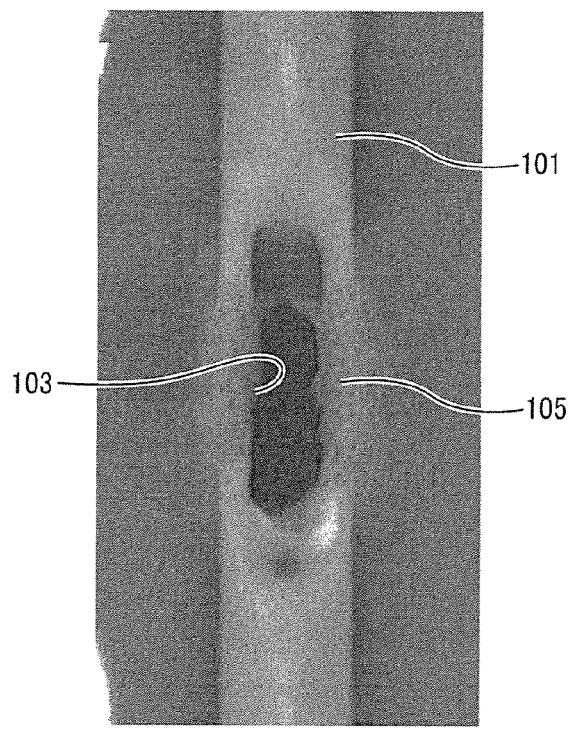
FIG. 4 shows a photograph taken with a scanning electron microscope showing a top view of a prior art metal fuse after the laser exposure.

FIG. 3-A shows a photograph taken by scanning electron microscope of a top view of the state of an aluminum layer formed over a tungsten layer that was exposed the laser. FIG. 3-B shows the photograph of FIG. 3-A from a diagonal top view. A laser which was used to create the state of FIGS. 3-A and 3-B has a spot diameter of 5 μm and a power of 15 μJ.

As shown in FIG. 3, the aluminum is liquefied and vaporized by the laser power. A peripheral part of the opening 13 swells a little so that the aluminum which liquefies without vaporization is rapidly solidified by means of the sudden thermal energy change. To the contrary, the tungsten that is located under the aluminum remains in place. In the embodiment of FIG. 1, above characteristic is applied to the fuse. As a result this, the scatter of the metal-vias are prevented to occur when the laser exposes, because the metal-vias are made from tungsten that the melting point and the boiling point thereof are higher than them of aluminum that is a material for the disconnecting metal of the fuse.

Table 1 shows a disconnection condition of fuses which have been disconnected by laser exposure and includes the fuse of the present invention and a prior metal fuse configured to a straight pattern. The fuse of the present invention (designated "VIA-PATTERN" in Table 1) includes a fifth metal interconnection layer made from aluminum for the disconnection metal of the fuse and metal-vias made from tungsten. The fifth metal interconnection layer is similar to the third metal interconnection layer 5-3 of FIG. 1. A length and a width of the fifth layer metal interconnection layer are 3.5 μm and 0.9 μm respectively. The metal-vias are formed having a surface shape of a circle (diameter 0.3 μm). The prior art metal fuse (designated "STRAIGHT PATTERN" in Table 1) includes a fifth layer metal interconnection layer made from aluminum. A width of the fifth layer metal interconnection layer is 0.8 μm. Twenty fuses are connected in parallel and each fuse connects between two electrodes respectively. A current value between the two electrodes is measured. In the measurement, the laser used for laser exposure has two different laser spot diameters. One is 3.7 μm, and other is 5.0 μm. The twenty fuses are disconnected by laser exposure, and a leak current between both the electrodes thereof is measured, to confirm the disconnection. As a result, the embodiments of the present invention have a leak current that is one tenth or one one-hundredth of the leak current of the prior art, as shown in Table 1.

| LASER SPOT DIAMETER (μm) | LASER POWER (μJ) | VIA-PATTERN (THE PRESENT INVENTION) (A) | STRAIGHT PATTERN (THE PRIOR ART) (A) |
|---|---|---|---|
| φ 3.7 | 1.6 | $1.86 \times 10^{-11}$ | $2.61 \times 10^{-9}$ |
|  | 1.8 | $1.47 \times 10^{-11}$ | $3.88 \times 10^{-10}$ |
| φ 5.0 | 1.8 | $7.95 \times 10^{-12}$ | $9.37 \times 10^{-11}$ |
|  | 2.0 | $5.20 \times 10^{-12}$ | $1.74 \times 10^{-10}$ |

As shown in Table 1, a disconnection condition of the fuse of the present invention is better than that of the metal fuse of the prior art. Thus the certainty of the fuse disconnection by the laser exposure may be improved by the present invention.

The above description and drawings are only to be considered illustrative of exemplary embodiments, which achieve features and advantages of the present invention. Modification and substitutions to specific conditions and structures can be made without departing from the spirit and scope of the present invention. Accordingly, the invention is not to be limited by the foregoing description and drawings, but is only limited by the scope of the appended claims.

For example, the third layer metal interconnection layer 5-3 may have a circle shape, oval shape or other shape. In addition, the disconnecting metal of the fuse that comprises the third layer metal interconnection layer 5-3 may be made from Cu (the melting point 1,083 degrees Celsius, the boiling point 2,567 degrees Celsius), aluminum alloy or other metal.

The disconnecting metal of the fuse may be formed with a laminate structure of a barrier-metal and a metal layer. The disconnecting metal of the fuse may be formed with a laminate structure of a barrier-metal, a metal layer and a cap-metal. For example, the barrier-metal may be formed with a laminated structure of Ti/TiN stacked sequentially from the bottom layer. Further, the barrier metal may also be formed Ti, or TiN. The metal layer may be formed with Al, AlCu, or AlSiCu. For example, the cap metal may be formed with a laminate structure stacked Ti/TiN sequentially from the bottom layer. Further, the barrier metal may also be formed TiN. The barrier metal, the metal layer and the cap metal are not to be limited by the above descriptions.

For example, the metal-vias 7-2 may be rectangular, oval shaped or have another shape. In addition, the metal-vias may be formed with other metal rather than tungsten.

The disconnecting metal of the fuse and the metal-vias may be formed with a laminate stacked structure of the barrier metal and the metal film.

The fuse structure is not to be limited by the following descriptions that the disconnecting metal of the fuse comprise the third layer metal interconnection layer 5-3 and that the under layer interconnection comprises the second layer metal interconnection 5-2 as in the above descriptions. For example, the disconnecting metal of the fuse may be formed of a first layer metal interconnection. In this case, the under interconnection may be formed of a polysilicon pattern or an impurity diffusion layer located on the semiconductor substrate. In addition, the disconnecting metal of the fuse may be formed of a second layer metal interconnection layer or a fourth or higher layer metal interconnection layer. The guard-ring may also not be presence. A location of the fuse is not to be limited as within an insulation film.

The invention claimed is:

1. A method of performing trimming of a semiconductor device, the method comprising the steps of:
   providing a metal fuse, wherein the metal fuse comprises:
   a disconnecting metal;
   a plurality of metal-vias that are connected under respective ends of the disconnecting metal; and
   a plurality of interconnections that connect to the disconnecting metal through respective metal-vias; and
   disconnecting the metal fuse by disconnecting the disconnecting metal of the metal fuse using a laser exposure, wherein the metal-vias are located inside of a spot diameter of a laser used for the laser exposure and are spaced apart from a side surface of the disconnecting metal,
   wherein the metal-vias remain and a top of each metal-via crops out in an opening formed by the disconnecting of the disconnecting metal of the metal fuse.

2. The method of claim 1, wherein a surface of the disconnecting metal is smaller than the spot diameter of the laser.

3. The method of claim 1, wherein the spot diameter of the laser is about 3.7 μm, a length of the disconnecting metal is about 3.5 μm, and a width of the disconnecting metal is about 0.9 μm.

4. The method of claim 1, wherein the disconnecting metal is formed of a material having a melting point and a boiling point that is lower than the melting point and boiling point of the metal-vias.

5. The method of claim 1, wherein the metal-vias are spaced apart from the side surface of the disconnecting metal at a distance sufficient to maintain insulation between any remaining part of the disconnecting metal and the metal-via, in a case where the disconnecting metal has a remaining part that is not disconnected on a side thereof after the laser exposure.

* * * * *